A

(12) United States Patent
Vellianitis

(10) Patent No.: US 11,189,490 B2
(45) Date of Patent: Nov. 30, 2021

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventor: Georgios Vellianitis, Heverlee (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/399,669

(22) Filed: Apr. 30, 2019

(65) Prior Publication Data
US 2020/0105527 A1 Apr. 2, 2020

Related U.S. Application Data

(60) Provisional application No. 62/738,595, filed on Sep. 28, 2018.

(51) Int. Cl.
H01L 21/02 (2006.01)
H01L 29/786 (2006.01)
H01L 29/66 (2006.01)
H01L 29/08 (2006.01)
H01L 29/04 (2006.01)
H01L 29/423 (2006.01)
H01L 29/78 (2006.01)
H01L 27/12 (2006.01)
H01L 21/84 (2006.01)

(52) U.S. Cl.
CPC .. *H01L 21/02672* (2013.01); *H01L 21/02532* (2013.01); *H01L 21/02592* (2013.01); *H01L 21/02595* (2013.01); *H01L 21/845* (2013.01); *H01L 27/1211* (2013.01); *H01L 29/04* (2013.01); *H01L 29/0847* (2013.01); *H01L 29/42392* (2013.01); *H01L 29/6656* (2013.01); *H01L 29/66772* (2013.01); *H01L 29/66795* (2013.01); *H01L 29/785* (2013.01); *H01L 29/78654* (2013.01); *H01L 21/0217* (2013.01); *H01L 21/0262* (2013.01); *H01L 29/66545* (2013.01)

(58) Field of Classification Search
CPC ............ H01L 21/02672; H01L 29/045; H01L 29/365; H01L 21/02532
See application file for complete search history.

(56) References Cited

U.S. PATENT DOCUMENTS 6,997,985 B1  2/2006 Yamazaki et al.
2004/0150043 A1  8/2004 Holm et al.
(Continued)

FOREIGN PATENT DOCUMENTS

KR  20050117467 A  12/2005
TW  I537438 B  6/2016

*Primary Examiner* — Dale E Page
*Assistant Examiner* — Wilner Jean Baptiste
(74) *Attorney, Agent, or Firm* — McDermott Will & Emery LLP

(57) ABSTRACT

In a method of manufacturing a semiconductor device, a single crystal oxide layer is formed over a substrate. After the single crystal oxide layer is formed, an isolation structure to define an active region is formed. A gate structure is formed over the single crystal oxide layer in the active region. A source/drain structure is formed.

20 Claims, 20 Drawing Sheets

(56) References Cited

U.S. PATENT DOCUMENTS

| | | | |
|---|---|---|---|
| 2006/0073648 A1 | 4/2006 | Park et al. | |
| 2007/0246752 A1* | 10/2007 | Cheng | H01L 29/66636 257/288 |
| 2013/0193431 A1* | 8/2013 | Yamazaki | H01L 29/04 257/43 |
| 2015/0102460 A1* | 4/2015 | Rocklein | H01L 28/40 257/532 |
| 2015/0162415 A1* | 6/2015 | Yin | H01L 21/28518 257/347 |
| 2015/0214256 A1 | 7/2015 | Miyairi | |
| 2019/0189769 A1* | 6/2019 | Basker | H01L 29/66553 |

* cited by examiner

METHOD OF MANUFACTURING A SEMICONDUCTOR DEVICE AND A SEMICONDUCTOR DEVICE

RELATED APPLICATIONS

This application claims priority of U.S. Provisional Patent Application No. 62/738,595 filed on Sep. 28, 2018, of which disclosure is entirely incorporated herein by reference.

BACKGROUND

Conventional complementary metal-oxide-semiconductor (CMOS) technology is often implemented to fabricate a large number of semiconductor devices, such as metal-oxide-semiconductor field effect transistors (MOSFETs) and bipolar junction transistors (BJTs), at approximately a same level on a single integrated-circuit (IC) chip. In advanced IC chips, transistors are disposed on multiple layers.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
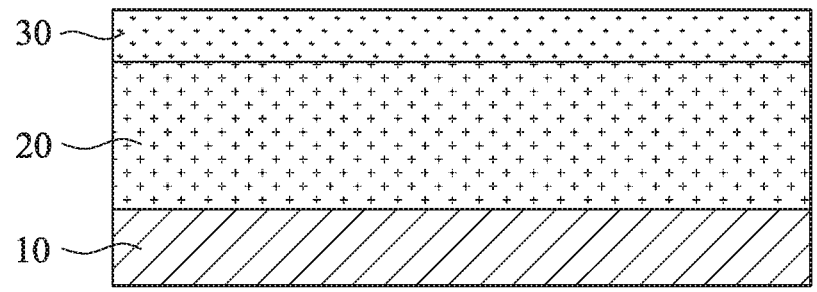
FIG. 1 shows one of the various stages of manufacturing a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

For a transistor fabrication process in the back-end of line, there is a key process to form a high quality crystalline semiconductor layer for a channel of the transistor over a non-crystalline layer, such as a silicon oxide layer. The method of manufacturing a crystalline semiconductor on a silicon oxide layer includes: (a) growing a semiconductor film in an amorphous state followed by high temperature annealing; and (b) growing a semiconductor layer by using a crystalline seed grown from a crystalline Si substrate. Both of these methods may not be suitable for a back-end-of-line process because: for method (a), there is a limitation in thermal budget, for example, less than 450° C., and for method (b), the crystalline seed layer needs to pass through several metal and interlayer dielectric layers.

The present disclosure provides a method to form a high quality crystalline semiconductor layer on an amorphous (non-crystal) dielectric layer. The present disclosure also provides a self-aligned method to fabricate transistors in the areas where polycrystalline or amorphous semiconductor layers are converted to a crystalline layer having a higher degree of crystallinity.

In the following embodiments, material, configurations, dimensions and/or processes of one embodiment may be employed in another embodiment, unless otherwise described, and detailed explanation thereof may be omitted.

FIGS. 1-13A show various stages of manufacturing a semiconductor FET device according to an embodiment of the present disclosure. It is understood that additional operations can be provided before, during, and after the operations shown by FIGS. 1-13A, and some of the operations described below can be replaced or eliminated, for additional embodiments of the method. The order of the operations/processes may be interchangeable. Further, in the present disclosure, a source and a drain are interchangeably used and a source/drain refers to at least one of a source and a drain.

As shown in FIG. 1, a substrate 10 is provided. In some embodiments, the substrate 10 includes a single crystal semiconductor layer on at least its surface portion. The substrate 10 may comprise a single crystal semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si, SiGe or Ge. The substrate 10 may include in its surface region, one or more buffer layers (not shown) in some embodiments. The buffer layers can serve to gradually change the lattice constant from that of the substrate to that of the source/drain regions. The buffer layers may be formed from epitaxially grown single crystal semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

Further, as shown in FIG. 1, one or more dielectric layers 20 are formed over the substrate 10. In some embodiments, one or more electronic devices, such as transistors, memories (e.g., dynamic random access memory (DRAM), static RAM, magnetic MRAM, and/or phase change RAM), are formed on the substrate 10 and the one or more dielectric layers 20 cover the electronic devices. Further, one or more metal wiring structures are embedded in the dielectric layers 20. The dielectric material for the dielectric layers 20 includes silicon oxide, silicon nitride, silicon oxynitride (SiON), SiCN, fluorine-doped silicate glass (FSG), or a low-K dielectric material, formed by LPCVD (low pressure chemical vapor deposition), plasma-CVD or flowable CVD or any other suitable film formation method. An annealing operation may be performed after the formation of the dielectric layer 20. In some embodiments, a planarization operation, such as a chemical mechanical polishing (CMP) method and/or an etch-back method, is performed to flatten the surface of the dielectric layer 20.

Still referring to FIG. 1, a semiconductor layer 30 as a channel semiconductor material is formed over the dielectric layer 20. The semiconductor material for the semiconductor layer 30 includes Si, Ge, SiGe, GaAs, InSb, GaP, GaSb, InAlAs, InGaAs, GaSbP, GaAsSb and InP, in some embodiments. In certain embodiments, the semiconductor layer 30 is made of Si, SiGe or Ge.

In some embodiments, the semiconductor layer 30 is formed by CVD, ALD or any other suitable film formation method. In some embodiments, the film formation is performed at a temperature less than about 450° C. In some embodiments, the film formation is performed at a temperature equal to or higher than about 25° C. In some embodiments, a $Si_2H_6$ gas is used as a source gas of Si and a $Ge_2H_6$ gas is used as a source gas of Ge. In certain embodiments, instead of or, in addition to, $Ge_2H_6$ and/or $Si_2H_6$, $GeH_4$ and/or $SiH_4$ is used. In some embodiments, the semiconductor layer 30 is amorphous or polycrystalline. In some embodiments, the semiconductor layer 30 is appropriately doped with impurities, such as P, As, Sb and/or B. The impurities are doped in-situ during the film formation, or doped by ion implantation or plasma doping after the semiconductor layer 30 is formed. A thickness of the semiconductor layer 30 is in a range from about 5 nm to about 500 nm in some embodiments, and is in a range from about 10 nm to about 50 nm in other embodiments.

Figure 2:
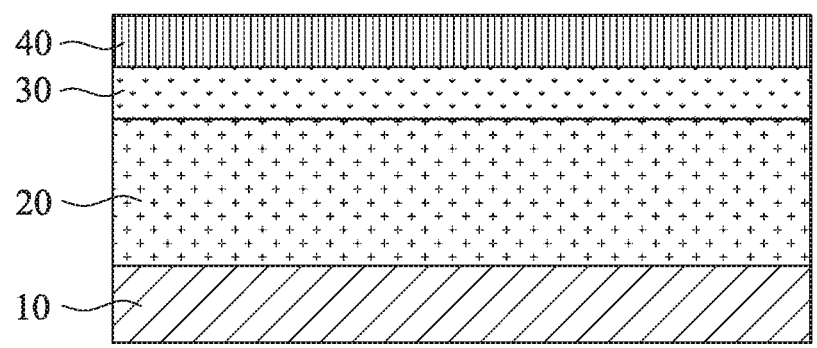
FIG. 2 shows one of the various stages of manufacturing a semiconductor FET device according to an embodiment of the present disclosure.

Then, as shown in FIG. 2, a seed layer 40 is formed over the semiconductor layer 30. In some embodiments, no seed layer is formed under the semiconductor layer 30. In some embodiments, the seed layer 40 is made of metal oxide having a property of being crystalline as deposited or with a low temperature annealing at about 300° C. to about 450° C. In certain embodiments, the seed layer 40 is made of magnesium oxide (MgO). In some embodiments, the MgO seed layer 40 is single crystalline. In other embodiments, the MgO seed layer 40 is poly crystalline or has multiple domains of single crystal. The seed layer 40 can be formed by CVD, atomic layer deposition (ALD), physical vapor deposition including sputtering, or any other suitable film formation method. A thickness of the seed layer 40 is in a range from about 1 nm to about 100 nm in some embodiments, and is in a range from about 2 nm to about 20 nm in other embodiments. In certain embodiments, the thickness of the seed layer 40 is in a range from about 1 nm to about 10 nm. In other embodiments, one of $HfO_2$, $La_2Hf_2O_7$, $Y_2O_3$, $SrTiO_3$ and $HfZrO_2$ is used as the seed layer 40.

Figure 3:
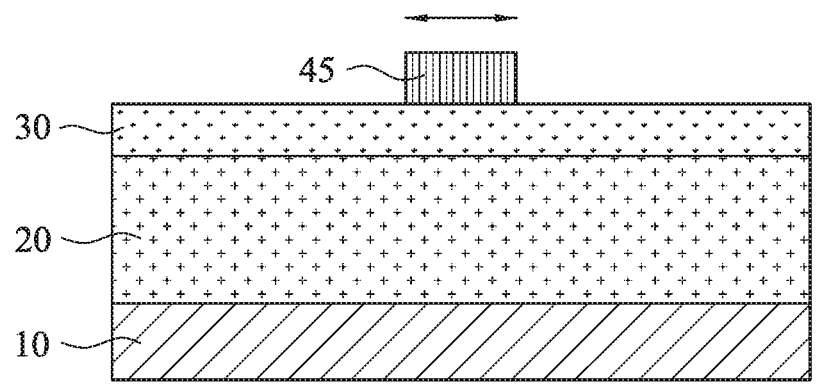
FIG. 3 shows one of the various stages of manufacturing a semiconductor FET device according to an embodiment of the present disclosure.
Figure 4:
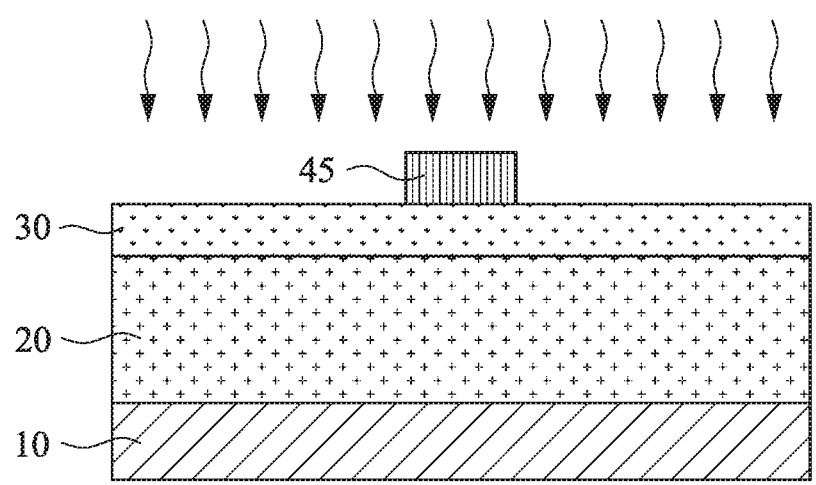
FIG. 4 shows one of the various stages of manufacturing a semiconductor FET device according to an embodiment of the present disclosure.

Next, as shown in FIG. 3, the seed layer 40 is patterned into a patterned seed layer 45, by using one or more lithography and etching operations. The lithography operation includes ultra violet (UV) lithography, deep UV (DUV) lithography, extreme UV (EUV) lithography, electron beam (e-beam) lithography, and the etching operation includes plasma dry etching. The patterned seed layer 45 corresponds to a gate electrode of an FET subsequently formed. Thus, the width W1 of the patterned seed layer 45 corresponds to a gate length of the FET and the patterned seed layer 45 has a shape corresponding to the gate electrode of the FET. In some embodiments, the patterned seed layer 45 has a line shape. The width W1 is in a range from about 5 nm to about 500 nm in some embodiments, and is in a range from about 20 nm to about 200 nm in other embodiments.

Subsequently, as shown in FIGS. 4-7, a crystallization process to crystalize the semiconductor layer 30 is performed. The crystallization process includes a thermal annealing. In some embodiments, the thermal annealing includes a laser annealing process using nano-second laser, which is transparent to the seed layer. In other embodiments, the thermal annealing includes a low temperature annealing at a temperature in a range from about 350° C. to 450° C.

Figure 5:
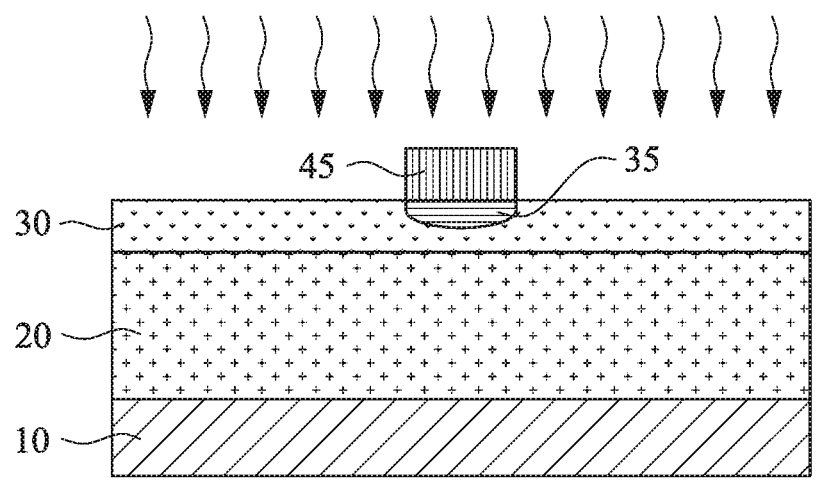
FIG. 5 shows one of the various stages of manufacturing a semiconductor FET device according to an embodiment of the present disclosure.
Figure 6:
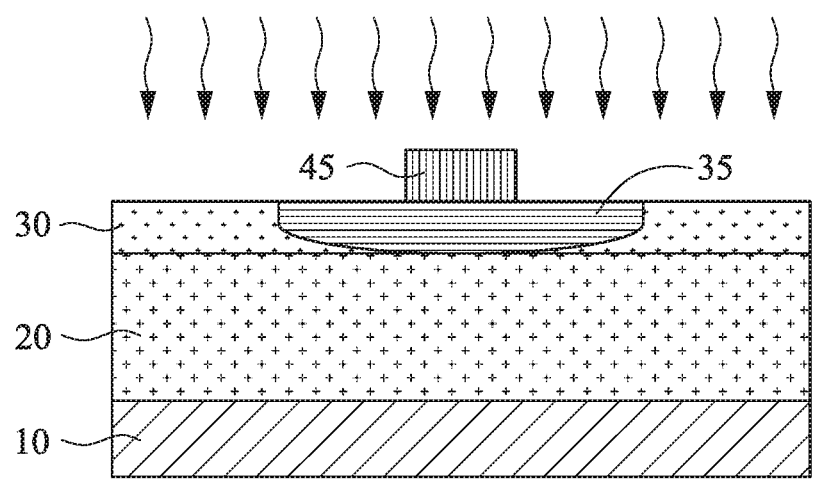
FIG. 6 shows one of the various stages of manufacturing a semiconductor FET device according to an embodiment of the present disclosure.
Figure 7:
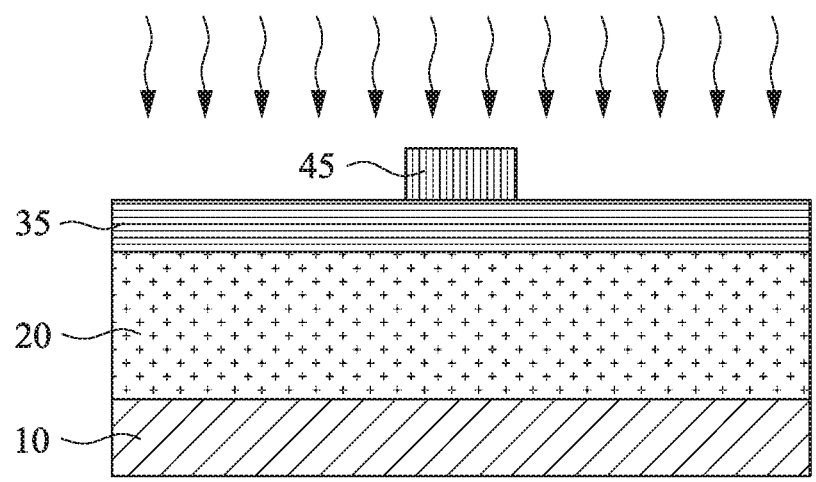
FIG. 7 shows one of the various stages of manufacturing a semiconductor FET device according to an embodiment of the present disclosure.

As shown in FIGS. 5 and 6, the semiconductor layer 30 starts to crystalize from the bottom of the patterned seed layer (corresponding to a channel region of the subsequently formed FET) as crystal template. By continuing the thermal annealing process, crystallized portions 35 of the semiconductor layer 30 laterally expand into source/drain regions as shown in FIG. 7. In some embodiments, the entire semiconductor layer 30 becomes crystal.

Figure 8:
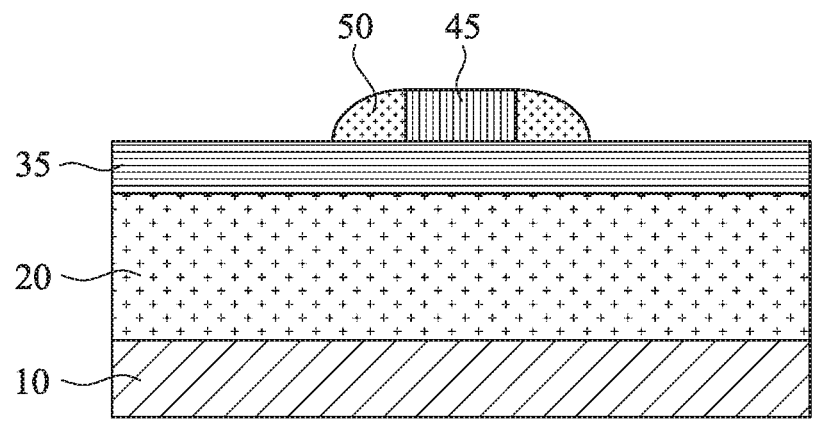
FIG. 8 shows one of the various stages of manufacturing a semiconductor FET device according to an embodiment of the present disclosure.

Subsequently, as shown in FIG. 8, sidewall spacers 50 are formed on opposite side faces of the patterned seed layer 45. A blanket layer of an insulating material for sidewall spacers 50 is conformally formed by using CVD or other suitable methods. The blanket layer is deposited in a conformal manner so that it is formed to have substantially equal thicknesses on vertical surfaces, such as the sidewalls, horizontal surfaces, and the top of the patterned seed layer 45. In some embodiments, the blanket layer is deposited to a thickness in a range from about 2 nm to about 30 nm. In one embodiment, the insulating material of the blanket layer is different from the materials of the patterned seed layer 45, and is made of a silicon nitride-based material, such as silicon nitride, SiON, SiOCN or SiCN and combinations thereof. In some embodiments, the blanket layer (sidewall spacers 50) is made of silicon nitride. The sidewall spacers 50 are formed on opposite side faces of the patterned seed layer 45, by anisotropic etching, as shown in FIG. 8. The patterned seed layer 45 functions as a dummy gate electrode in a gate replacement technology.

Figure 9:
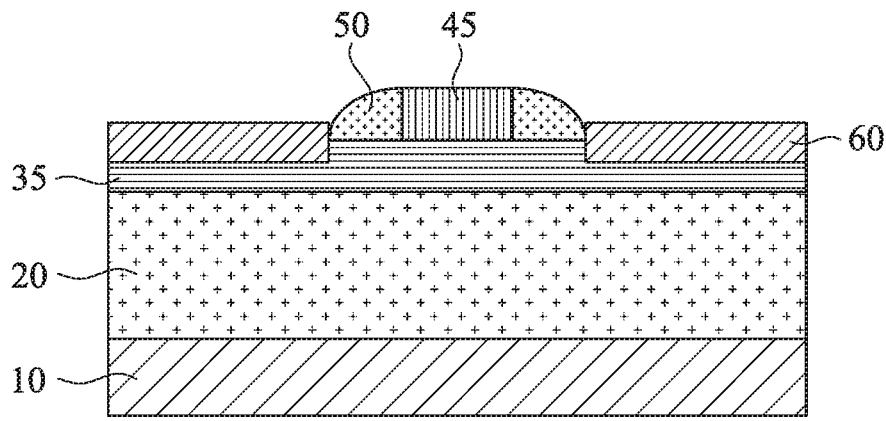
FIG. 9 shows one of the various stages of manufacturing a semiconductor FET device according to an embodiment of the present disclosure.

Then, as shown in FIG. 9, a source region and a drain region are formed. In some embodiments, the source/drain regions 60 include one or more epitaxial semiconductor layers. The source/drain epitaxial layer 60 includes one or more layers of Si, SiP, SiC and SiCP for an n-channel FET or Si, SiGe, Ge for a p-channel FET. For the P-channel FET, boron (B) may also be contained in the source/drain region. The source/drain epitaxial layer 50 is formed by an epitaxial growth method using CVD, ALD or MBE. In some embodiments, the source/drain regions of the crystallized semiconductor layer 35 are recessed by etching and then the source/drain epitaxial layer 60 is formed over the recessed source/drain regions of the crystallized semiconductor layer 35. In other embodiments, one or more ion implantation processes are performed to introduce impurities into the source/drain regions of the crystallized semiconductor layer 35.

Figure 10:
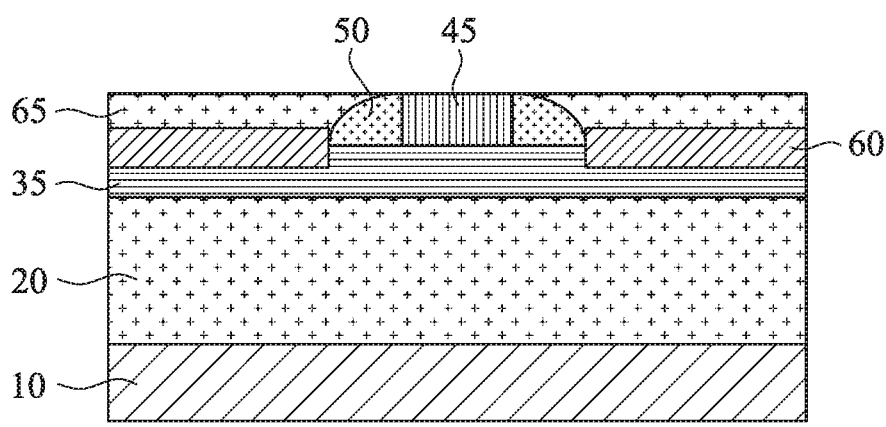
FIG. 10 shows one of the various stages of manufacturing a semiconductor FET device according to an embodiment of the present disclosure.

Then, a first interlayer dielectric (ILD) layer 65 is formed over the source/drain epitaxial layer 60 and the patterned seed layer 45. The materials for the first ILD layer 65 include compounds comprising Si, O, C and/or H, such as silicon oxide, SiCOH and SiOC. Organic materials, such as polymers, may be used for the first ILD layer 65. After the first ILD layer 65 is formed, a planarization operation, such as CMP, is performed, so that the top portion of the patterned seed layer 45 is exposed, as shown in FIG. 10. In some embodiments, the patterned seed layer 45 functions as a CMP stop layer. In some embodiments, before the first ILD layer 65 is formed, a contact etch stop layer, such as a silicon nitride layer or a silicon oxynitride layer, is formed.

Figure 11:
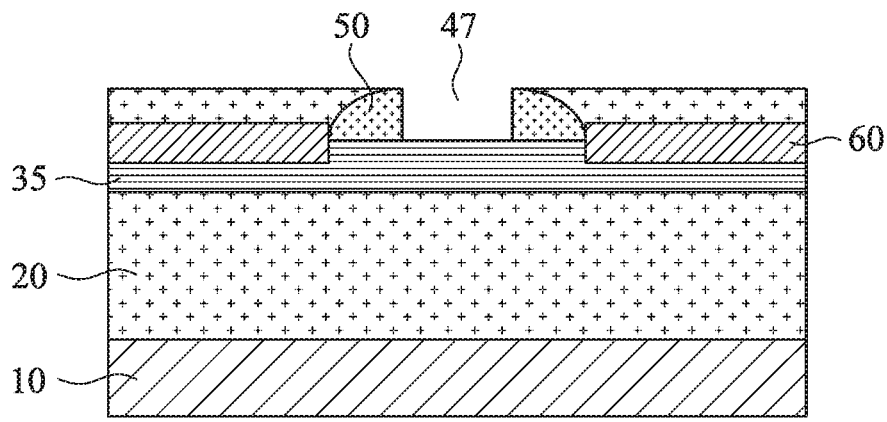
FIG. 11 shows one of the various stages of manufacturing a semiconductor FET device according to an embodiment of the present disclosure.

Then, the patterned seed layer 45 is removed, thereby forming a gate space 47, as shown in FIG. 11. The patterned seed layer 45 can be removed using plasma dry etching and/or wet etching.

Figure 12:
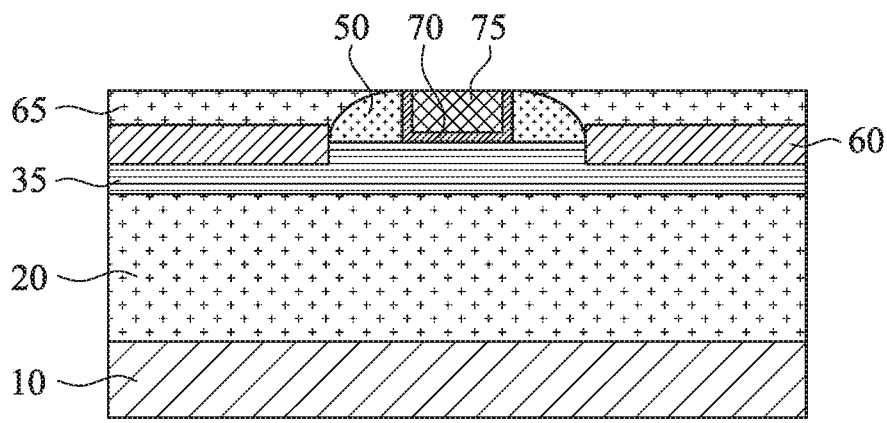
FIG. 12 shows one of the various stages of manufacturing a semiconductor FET device according to an embodiment of the present disclosure.

After the patterned seed layer 45 is removed, a gate dielectric layer 70 and a gate electrode 75 are formed in the gate space 47, as shown in FIG. 12. In some embodiments, the gate dielectric layer 70 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 70 includes an interfacial layer formed between the channel layer 35 and the dielectric material, by using chemical oxidation. The gate dielectric layer 70 may be formed by CVD, ALD or any suitable method. In one embodiment, the gate dielectric layer 70 is formed using a highly conformal deposition process such as ALD in order to ensure the formation of a gate dielectric layer having a uniform thickness around each channel layer. The thickness of the gate dielectric layer 70 is in a range from about 1 nm to about 10 nm in one embodiment.

Subsequently, a gate electrode layer 75 is formed on the gate dielectric layer 70. The gate electrode layer 75 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 75 may be formed by CVD, ALD, electro-plating, or other suitable method. The metals for the gate dielectric layer 75 and the gate electrode layer 75 are also deposited over the upper surface of the first ILD layer 65. The material for the gate electrode layer formed over the ILD layer 65 is then planarized by using, for example, CMP, until the top surface of the ILD layer 65 is revealed. In some embodiments, after the planarization operation, the metal gate electrode layer 77 is recessed and a cap insulating layer (not shown) is formed over the recessed gate electrode layer. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 70 and the gate electrode layer 75. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 13A:
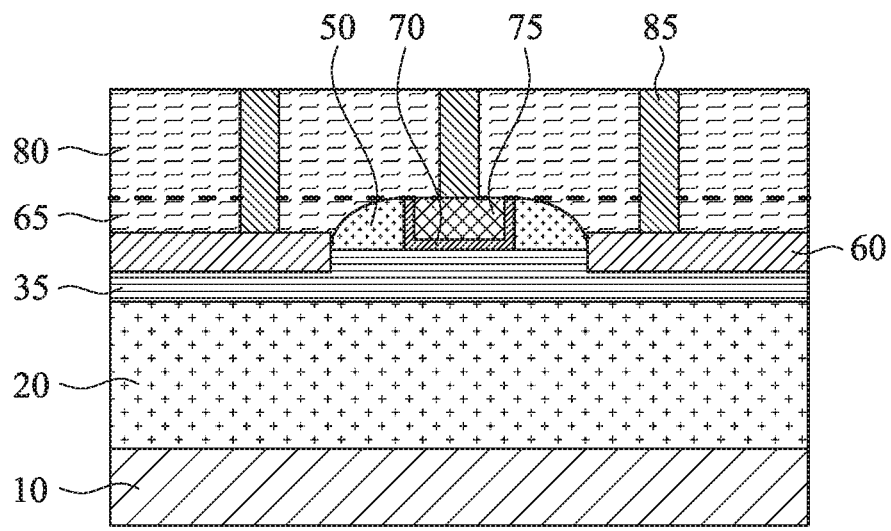
FIGS. 13A and 13B show one of the various stages of manufacturing a semiconductor FET device according to an embodiment of the present disclosure.
Figure 13B:
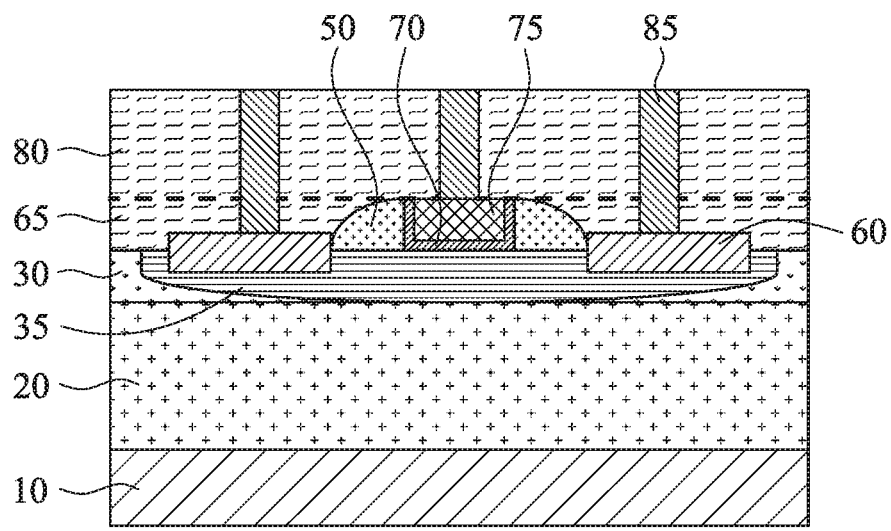

Further, as shown in FIG. 13A, a second ILD layer 80 is formed over the first ILD layer 65, and conductive contacts 85 passing through the second ILD layer 80 or the second and first ILD layers are formed to contact the gate electrode 75 and the source/drain epitaxial layers 60. Contact openings are formed in the first and/or the second ILD layers. One or more layers of conductive materials are formed in and over the contact openings and then a planarization operation, such as a CMP operation, is performed to form conductive contacts 85, as shown in FIG. 13A. In some embodiments, the conductive contacts 85 include a liner layer and a body layer. The liner layer is a barrier layer and/or a glue (adhesion) layer. In some embodiments, a Ti layer is formed on the source/drain epitaxial layer 55 and a TiN or TaN layer is formed on the Ti layer, as the liner layer. The body layer includes one or more layers of Co, Ni, W, Ti, Ta, Cu and Al, or any other suitable material.

It is understood that the FET undergoes further CMOS processes to form various features such as contacts/vias, interconnect metal layers, dielectric layers, passivation layers, etc.

In other embodiments, as shown in FIG. 13A, the crystallization process stops when the crystallized portions 35 are formed in the necessary regions, such as channel regions and the source/drain regions. Accordingly, there is a portion of the non-crystallized semiconductor layer 30, which is amorphous or poly crystal.

FIGS. 14-23 show various stages of manufacturing a semiconductor FET device according to an embodiment of the present disclosure. It is understood that additional operations can be provided before, during, and after the operations shown by FIGS. 14-23, and some of the operations described below can be replaced or eliminated, for additional embodiments of the method. The order of the operations/processes may be interchangeable.

Figure 14:
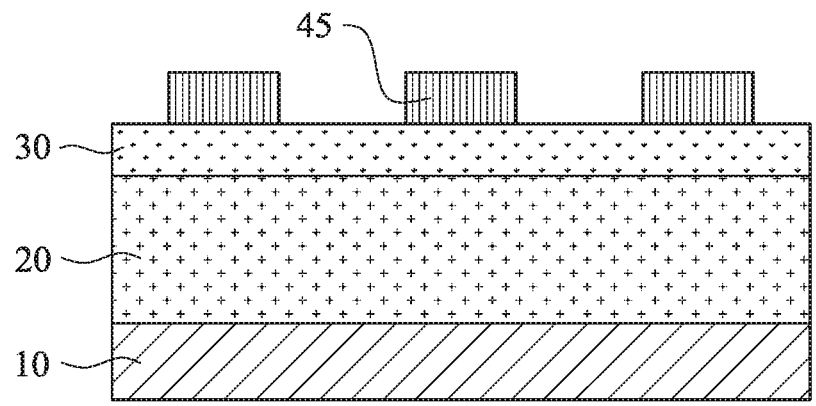
FIG. 14 shows one of the various stages of manufacturing a semiconductor FET device according to another embodiment of the present disclosure.
Figure 15:
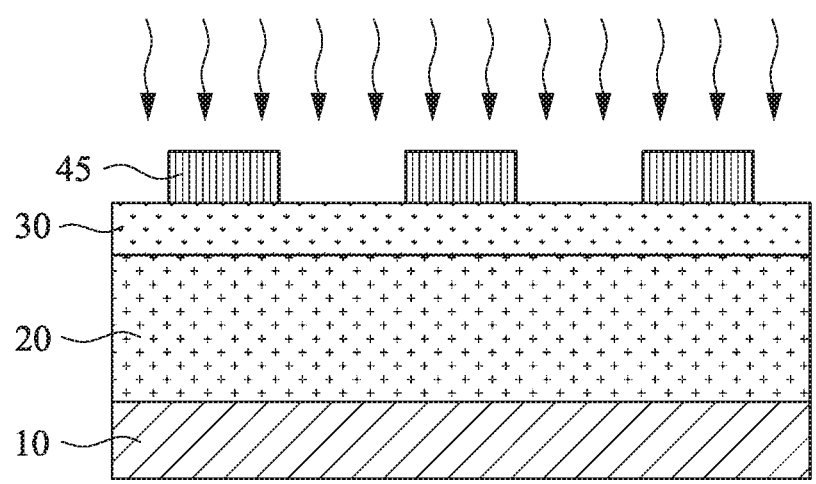
FIG. 15 shows one of the various stages of manufacturing a semiconductor FET device according to another embodiment of the present disclosure.

Similar to FIGS. 1 and 2, a seed layer 40 is formed over a semiconductor layer 30. Next, as shown in FIG. 14, the seed layer 40 is patterned into multiple patterned seed layers 45, by using one or more lithography and etching operations. The lithography operation includes UV lithography, DUV lithography, EUV lithography, e-beam lithography, and the etching operation includes plasma dry etching. The patterned seed layers 45 correspond to gate electrodes of FETs subsequently formed. In some embodiments, the patterned seed layers 45 have a line shape. The width of the patterned seed layers 45 are in a range from about 5 nm to about 500 nm in some embodiments, and is in a range from about 20 nm to about 200 nm in other embodiments.

Subsequently, as shown in FIGS. 15-18, a crystallization process to crystalize the semiconductor layer 30 is performed. The crystallization process includes a thermal annealing. In some embodiments, the thermal annealing includes a laser annealing process using nano-second laser, which is transparent to the seed layer. In other embodiments, the thermal annealing includes a low temperature annealing at a temperature in a range from about 350° C. to 450° C.

Figure 16:
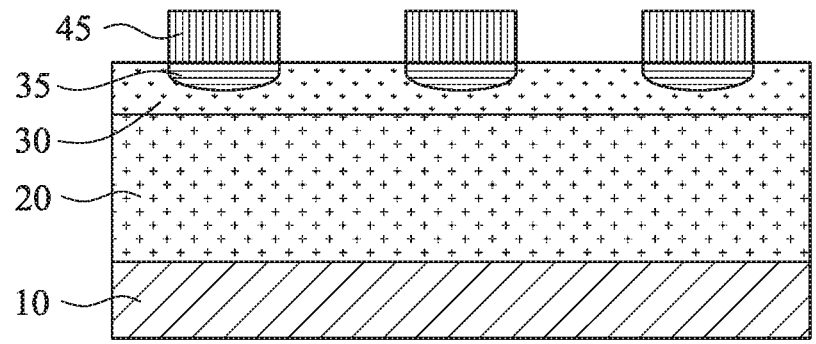
FIG. 16 shows one of the various stages of manufacturing a semiconductor FET device according to another embodiment of the present disclosure.
Figure 17:
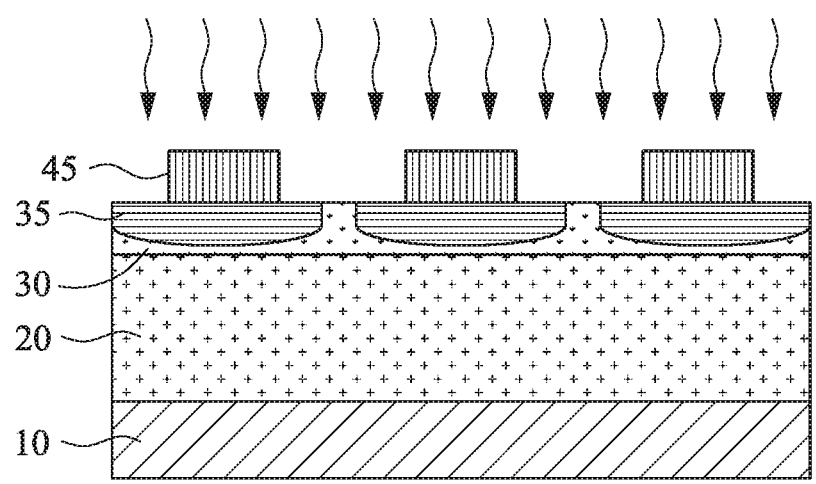
FIG. 17 shows one of the various stages of manufacturing a semiconductor FET device according to another embodiment of the present disclosure.

As shown in FIGS. 16 and 17, the semiconductor layer 30 starts to crystalize from the bottoms of the patterned seed layers 45 (corresponding to channel regions of the subsequently formed FETs) as crystal template. By continuing the thermal annealing process, crystallized portions 35 of the semiconductor layer 30 laterally expand into source/drain regions as shown in FIG. 17.

Figure 18:
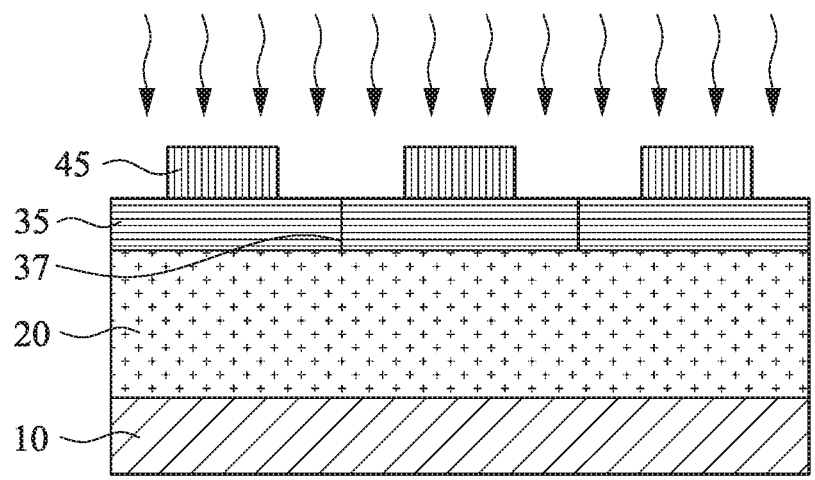
FIG. 18 shows one of the various stages of manufacturing a semiconductor FET device according to another embodiment of the present disclosure.

As shown in FIG. 18, each of front portions of the crystallized semiconductor layers 35 meet the adjacent front portion of the crystallized semiconductor layers 35, creating a grain boundary 37.

Figure 19:
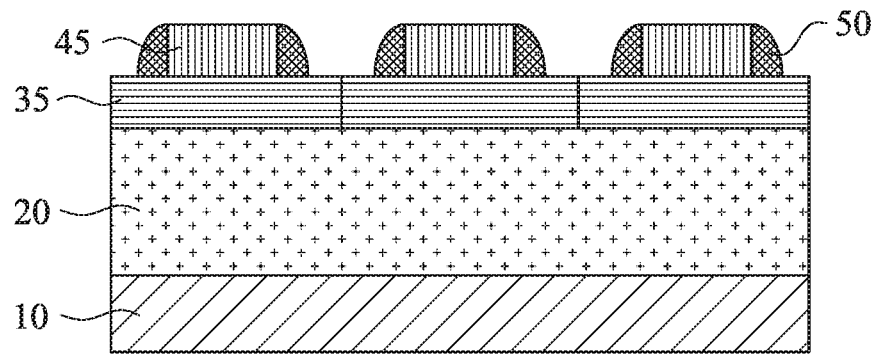
FIG. 19 shows one of the various stages of manufacturing a semiconductor FET device according to another embodiment of the present disclosure.

Subsequently, as shown in FIG. 19, sidewall spacers 50 are formed on opposite side faces of the patterned seed layers 45. A blanket layer of an insulating material for sidewall spacers 50 is conformally formed by using CVD or other suitable methods. The blanket layer is deposited in a conformal manner so that it is formed to have substantially equal thicknesses on vertical surfaces, such as the sidewalls, horizontal surfaces, and the top of the patterned seed layers 45. In some embodiments, the blanket layer is deposited to a thickness in a range from about 2 nm to about 30 nm. In one embodiment, the insulating material of the blanket layer is different from the materials of the patterned seed layers 45, and is made of a silicon nitride-based material, such as silicon nitride, SiON, SiOCN or SiCN and combinations thereof. In some embodiments, the blanket layer (sidewall spacers 50) is made of silicon nitride. The sidewall spacers 50 are formed on opposite side faces of the patterned seed layers 45, by anisotropic etching, as shown in FIG. 8. The patterned seed layers 45 function as a dummy gate electrode in a gate replacement technology.

Figure 20:
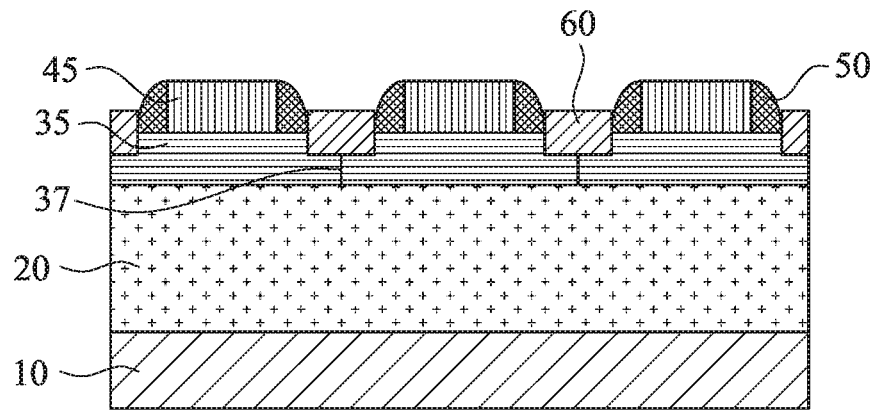
FIG. 20 shows one of the various stages of manufacturing a semiconductor FET device according to another embodiment of the present disclosure.

Then, as shown in FIG. 20, source regions and drain regions are formed. In some embodiments, the source/drain regions 60 include one or more epitaxial semiconductor layers. The source/drain epitaxial layers 60 include one or more layers of Si, SiP, SiC and SiCP for an n-channel FET or Si, SiGe, Ge for a p-channel FET. For the P-channel FET, boron (B) may also be contained in the source/drain region. The source/drain epitaxial layer 50 is formed by an epitaxial growth method using CVD, ALD or MBE. In some embodiments, the source/drain regions of the crystallized semiconductor layer 35 are recessed by etching and then the source/drain epitaxial layers 60 are formed over the recessed source/drain regions of the crystallized semiconductor layer 35. In other embodiments, one or more ion implantation processes are performed to introduce impurities into the source/drain regions of the crystallized semiconductor layer 35. In some embodiments, the source/drain epitaxial layers 60 fully fill spaces between adjacent dummy gate electrodes (patterned seed layers 45), and in other embodiments, the source/drain epitaxial layers 60 only partially fill spaces between adjacent dummy gate electrodes.

Figure 21:
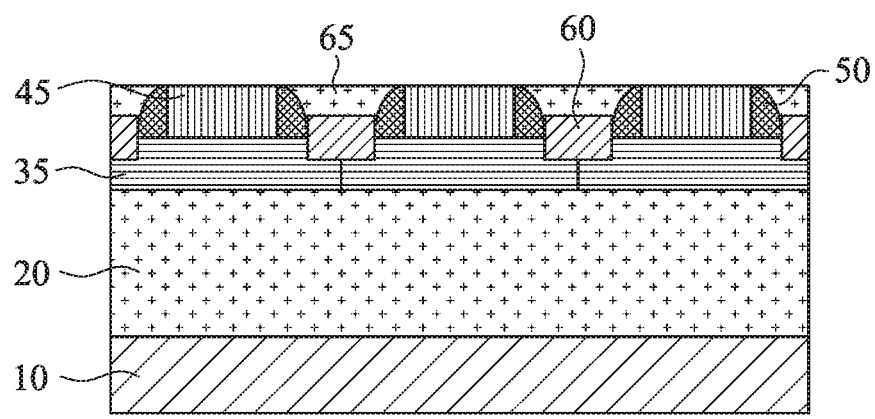
FIG. 21 shows one of the various stages of manufacturing a semiconductor FET device according to another embodiment of the present disclosure.

Then, a first interlayer dielectric (ILD) layer 65 is formed over the source/drain epitaxial layers 60 and the patterned seed layers 45. The materials for the first ILD layer 65 include compounds comprising Si, O, C and/or H, such as silicon oxide, SiCOH and SiOC. Organic materials, such as polymers, may be used for the first ILD layer 65. After the first ILD layer 65 is formed, a planarization operation, such as CMP, is performed, so that the top portions of the patterned seed layers 45 are exposed, as shown in FIG. 21. In some embodiments, the patterned seed layers 45 function as a CMP stop layer. In some embodiments, before the first ILD layer 65 is formed, a contact etch stop layer, such as a silicon nitride layer or a silicon oxynitride layer, is formed.

Figure 22:
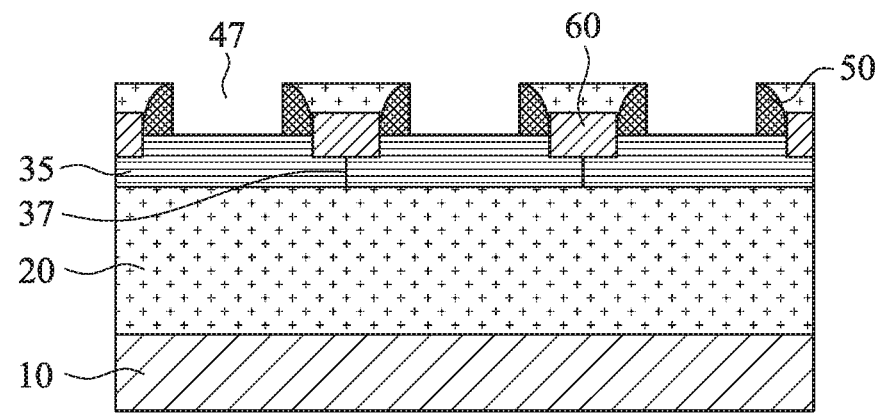
FIG. 22 shows one of the various stages of manufacturing a semiconductor FET device according to another embodiment of the present disclosure.

Then, the patterned seed layers 45 are removed, thereby forming gate spaces 47, as shown in FIG. 22. The patterned seed layers 45 can be removed using plasma dry etching and/or wet etching.

Figure 23:
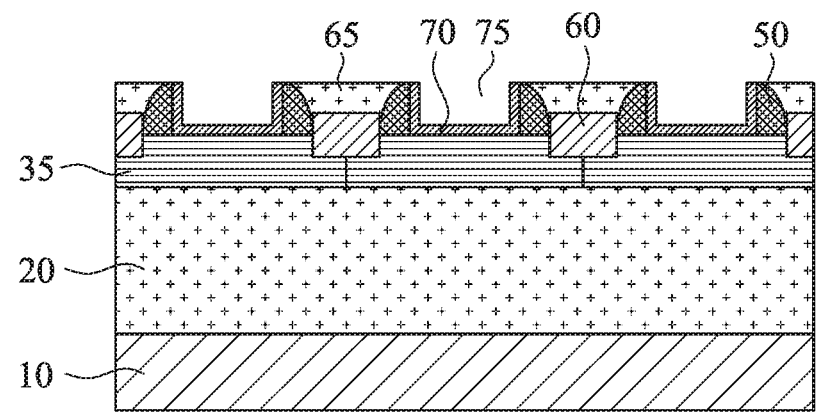
FIG. 23 shows one of the various stages of manufacturing a semiconductor FET device according to another embodiment of the present disclosure.
Figure 24:
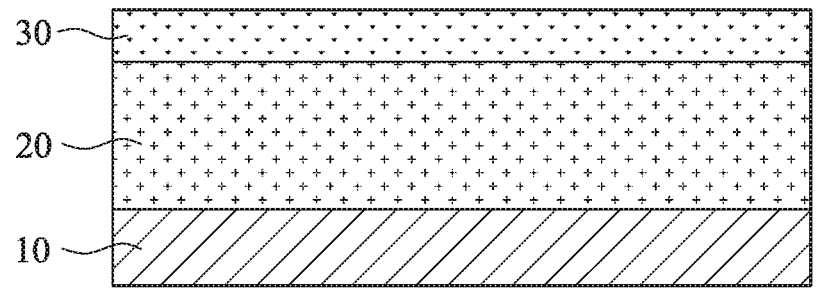
FIG. 24 shows one of the various stages of manufacturing a semiconductor FET device according to another embodiment of the present disclosure.

After the patterned seed layers 45 are removed, a gate dielectric layer 70 and a gate electrode 75 are formed in each of the gate spaces 47, as shown in FIG. 23. In some embodiments, the gate dielectric layer 70 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 70 includes an interfacial layer formed between the channel layer 35 and the dielectric material, by using chemical oxidation. The gate dielectric layer 70 may be formed by CVD, ALD or any suitable method. In one embodiment, the gate dielectric layer 70 is formed using a highly conformal deposition process such as ALD in order to ensure the formation of a gate dielectric layer having a uniform thickness around each channel layer. The thickness of the gate dielectric layer 70 is in a range from about 1 nm to about 10 nm in one embodiment.

Subsequently, a gate electrode layer 75 is formed on the gate dielectric layer 70. The gate electrode layer 75 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 75 may be formed by CVD, ALD, electro-plating, or other suitable method. The metals for the gate dielectric layer 70 and the gate electrode layer 75 are also deposited over the upper surface of the first ILD layer 65. The material for the gate electrode layer formed over the ILD layer 65 is then planarized by using, for example, CMP, until the top surface of the ILD layer 65 is revealed. In some embodiments, after the planarization operation, the metal gate electrode layer 77 is recessed and a cap insulating layer (not shown) is formed over the recessed gate electrode layer. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 70 and the gate electrode layer 75. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Further, similar to FIG. 13A, a second ILD layer is formed over the first ILD layer, and conductive contacts passing through the second ILD layer or the second and first ILD layers are formed to contact the gate electrode and the source/drain epitaxial layers.

In other embodiments, the crystallization process stops before each of front portions of the crystallized semiconductor layers 35 meet the adjacent front portion of the crystallized semiconductor layers 35. In such a case, a portion of non-crystallized semiconductor layer 30 remains between adjacent FETs.

It is understood that the FET undergoes further CMOS processes to form various features such as contacts/vias, interconnect metal layers, dielectric layers, passivation layers, etc.

FIGS. 24-36A show various stages of manufacturing a semiconductor FET device according to an embodiment of the present disclosure. It is understood that additional operations can be provided before, during, and after the operations shown by FIGS. 24-36A, and some of the operations described below can be replaced or eliminated, for additional embodiments of the method. The order of the operations/processes may be interchangeable.

Figure 25:
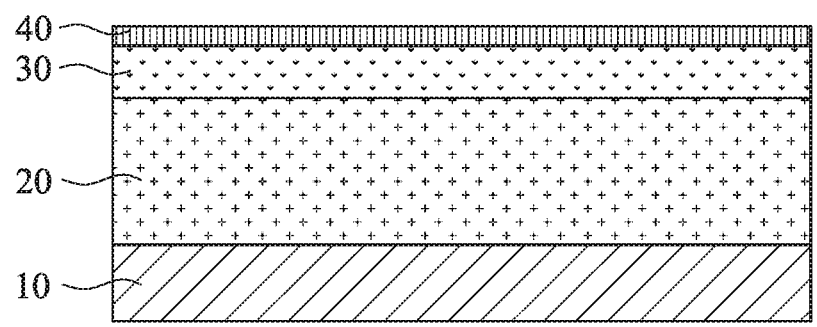
FIG. 25 shows one of the various stages of manufacturing a semiconductor FET device according to another embodiment of the present disclosure.

Similar to FIG. 1, a semiconductor layer 30 is formed over a dielectric layer 20 disposed over a substrate 10, as shown in FIG. 25. Then, similar to FIG. 2, a seed layer 40 is formed over the semiconductor layer 30, as shown in FIG. 25. In some embodiments, the seed layer 40 is made of metal oxide having a property of being crystalline as deposited or with a low temperature annealing at about 350° C. to about 450° C. In certain embodiments, the seed layer 40 is made of magnesium oxide (MgO). In some embodiments, the MgO seed layer 40 is single crystalline. In other embodiments, the MgO seed layer 40 is poly crystalline or has multiple domains of single crystal. The seed layer 40 can be formed by CVD, atomic layer deposition (ALD), physical vapor deposition including sputtering, or any other suitable film formation method. A thickness of the seed layer 40 is in a range from about 1 nm to about 100 nm in some embodiments, and is in a range from about 2 nm to about 20 nm in other embodiments. In certain embodiments, the thickness of the seed layer 40 is in a range from about 1 nm to about 10 nm.

Figure 26:
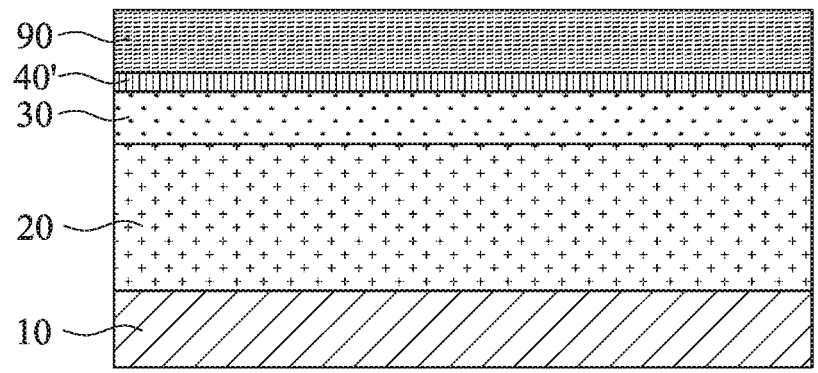
FIG. 26 shows one of the various stages of manufacturing a semiconductor FET device according to another embodiment of the present disclosure.

Then, as shown in FIG. 26, a dummy gate layer 90 is formed over the seed layer 45. In some embodiments, the dummy gate layer 90 is made of poly silicon or amorphous silicon. Other semiconductor material or dielectric material, which can be selectively removed with respect to an ILD layer and sidewall spacers, may also be used. A thickness of the dummy gate layer 90 is in a range from about 50 nm to about 500 nm in some embodiments, and is in a range from about 100 nm to 200 nm in other embodiments. The dummy gate layer 90 can be formed by CVD, atomic layer deposition (ALD), physical vapor deposition including sputtering, or any other suitable film formation method.

Figure 27:
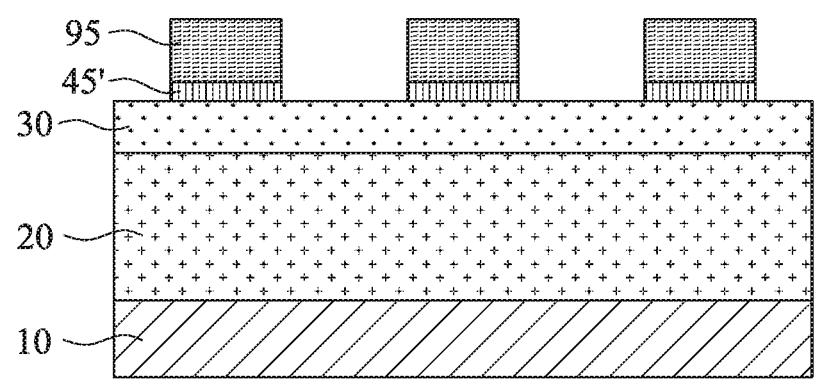
FIG. 27 shows one of the various stages of manufacturing a semiconductor FET device according to another embodiment of the present disclosure.
Figure 28:
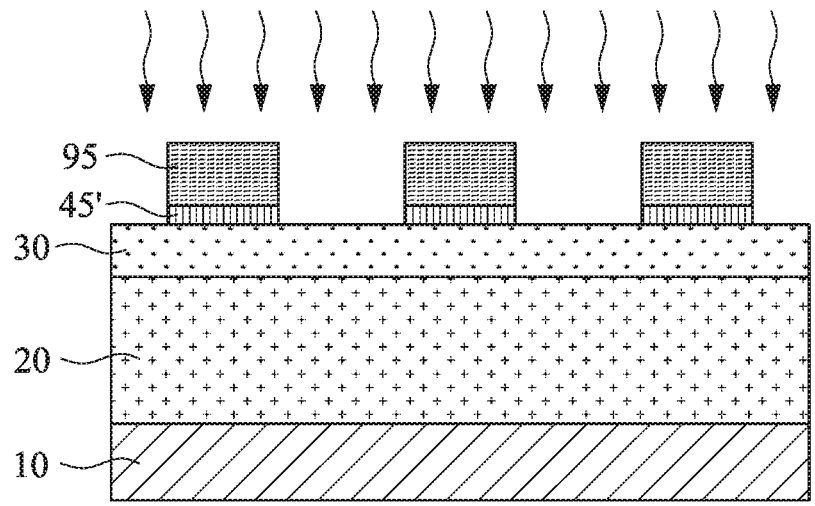
FIG. 28 shows one of the various stages of manufacturing a semiconductor FET device according to another embodiment of the present disclosure.

Next, as shown in FIG. 27, the dummy gate layer 90 and the seed layer 40 are patterned into multiple patterned dummy gate layer 95 and patterned seed layers 45, by using one or more lithography and etching operations. The lithography operation includes UV lithography, DUV lithography, EUV lithography, e-beam lithography, and the etching operation includes plasma dry etching. The patterned dummy gate layer 95 and patterned seed layers 45 correspond to gate electrodes of FETs subsequently formed. In some embodiments, the patterned dummy gate layer 95 and patterned seed layers 45 have a line shape. The width of the patterned dummy gate layer 95 and patterned seed layers 45 are in a range from about 5 nm to about 500 nm in some embodiments, and is in a range from about 20 nm to about 200 nm in other embodiments.

Subsequently, as shown in FIGS. 28-31, a crystallization process to crystalize the semiconductor layer 30 is performed. The crystallization process includes a thermal annealing. In some embodiments, the thermal annealing includes a laser annealing process using nano-second laser, which is transparent to the seed layer. In other embodiments, the thermal annealing includes a low temperature annealing at a temperature in a range from about 350° C. to 450° C.

Figure 29:
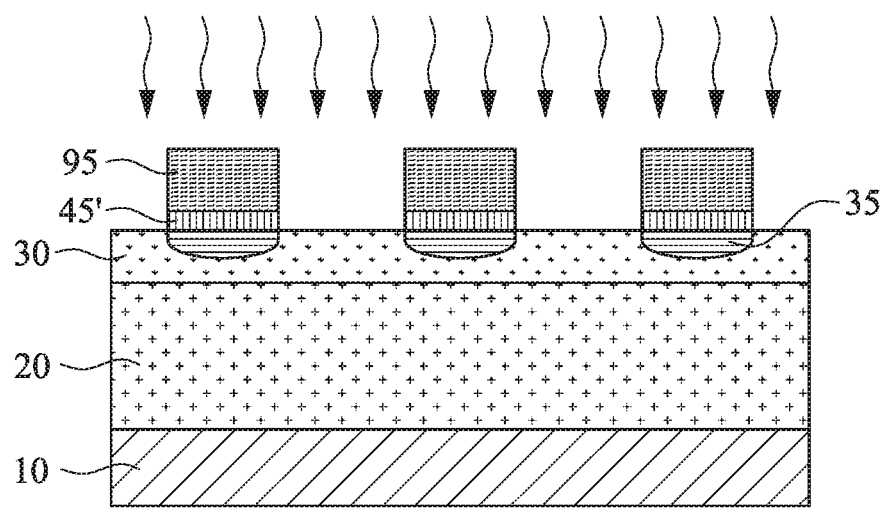
FIG. 29 shows one of the various stages of manufacturing a semiconductor FET device according to another embodiment of the present disclosure.
Figure 30:
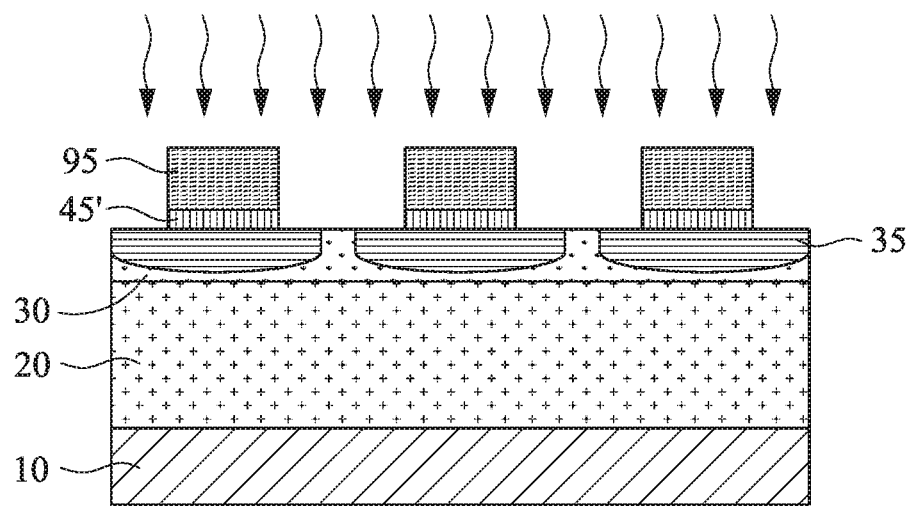
FIG. 30 shows one of the various stages of manufacturing a semiconductor FET device according to another embodiment of the present disclosure.

As shown in FIGS. 29 and 30, the semiconductor layer 30 starts to crystalize from the bottoms of the patterned seed layers 45 (corresponding to channel regions of the subsequently formed FETs) as crystal template. By continuing the thermal annealing process, crystallized portions 35 of the semiconductor layer 30 laterally expand into source/drain regions as shown in FIG. 30.

Figure 31:
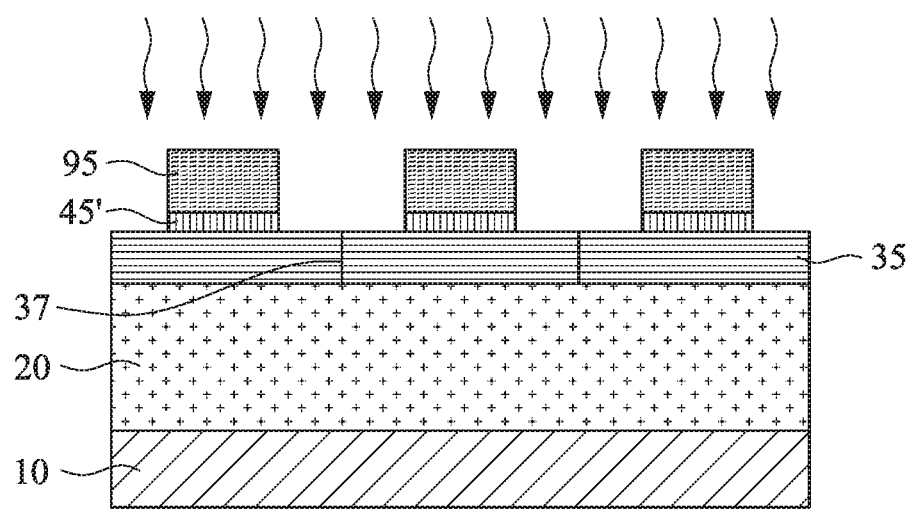
FIG. 31 shows one of the various stages of manufacturing a semiconductor FET device according to another embodiment of the present disclosure.

As shown in FIG. 31, each of front portions of the crystallized semiconductor layers 35 meet the adjacent front portion of the crystallized semiconductor layers 35, creating a grain boundary 37.

Figure 32:
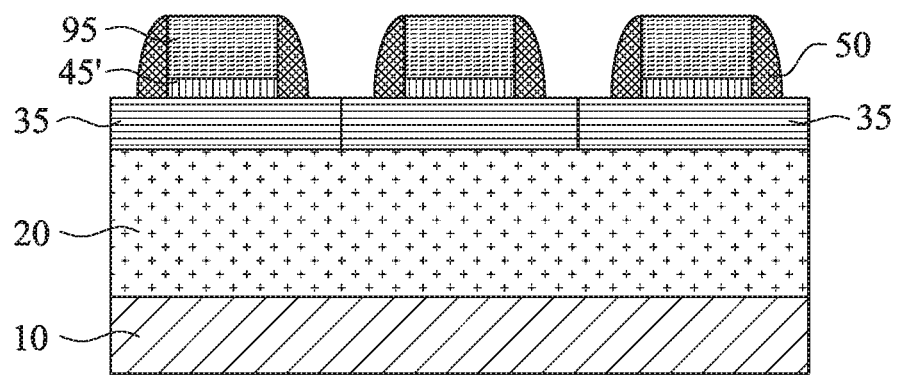
FIG. 32 shows one of the various stages of manufacturing a semiconductor FET device according to another embodiment of the present disclosure.

Subsequently, as shown in FIG. 32, sidewall spacers 50 are formed on opposite side faces of the patterned dummy gate layer 95 and patterned seed layers 45. A blanket layer of an insulating material for sidewall spacers 50 is conformally formed by using CVD or other suitable methods. The blanket layer is deposited in a conformal manner so that it is formed to have substantially equal thicknesses on vertical surfaces, such as the sidewalls, horizontal surfaces, and the top of the patterned dummy gate layer 95 and patterned seed layers 45. In some embodiments, the blanket layer is deposited to a thickness in a range from about 2 nm to about 30 nm. In one embodiment, the insulating material of the blanket layer is different from the materials of the patterned dummy gate layer 95 and patterned seed layers 45, and is made of a silicon nitride-based material, such as silicon nitride, SiON, SiOCN or SiCN and combinations thereof. In some embodiments, the blanket layer (sidewall spacers 50) is made of silicon nitride. The sidewall spacers 50 are formed on opposite side faces of the patterned dummy gate layer 95 and patterned seed layers 45, by anisotropic etching, as shown in FIG. 8. The patterned dummy gate layer 95 and patterned seed layers 45 function as a dummy gate electrode in a gate replacement technology.

Figure 33:
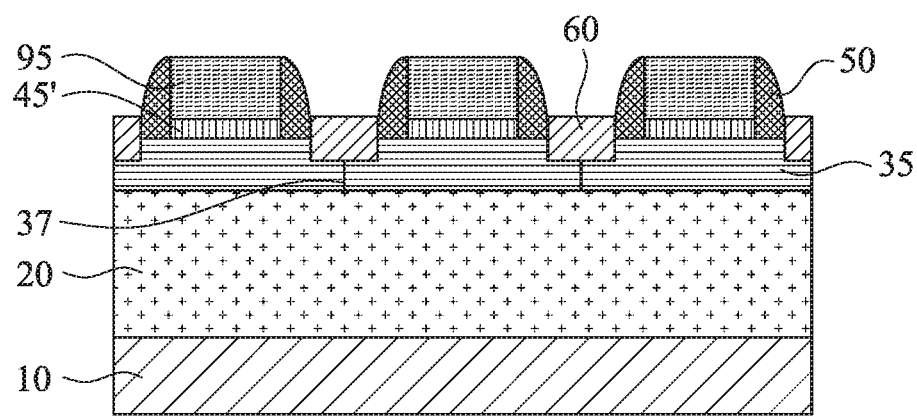
FIG. 33 shows one of the various stages of manufacturing a semiconductor FET device according to another embodiment of the present disclosure.

Then, as shown in FIG. 33, source regions and drain regions are formed. In some embodiments, the source/drain regions 60 include one or more epitaxial semiconductor layers. The source/drain epitaxial layers 60 include one or more layers of Si, SiP, SiC and SiCP for an n-channel FET or Si, SiGe, Ge for a p-channel FET. For the P-channel FET, boron (B) may also be contained in the source/drain region. The source/drain epitaxial layer 50 is formed by an epitaxial growth method using CVD, ALD or MBE. In some embodiments, the source/drain regions of the crystallized semiconductor layer 35 are recessed by etching and then the source/drain epitaxial layers 60 are formed over the recessed source/drain regions of the crystallized semiconductor layer 35. In other embodiments, one or more ion implantation processes are performed to introduce impurities into the source/drain regions of the crystallized semiconductor layer 35. In some embodiments, the source/drain epitaxial layers 60 fully fill spaces between adjacent dummy gate electrodes (patterned dummy gate layer 95 and patterned seed layers 45), and in other embodiments, the source/drain epitaxial layers 60 only partially fill spaces between adjacent dummy gate electrodes.

Figure 34:
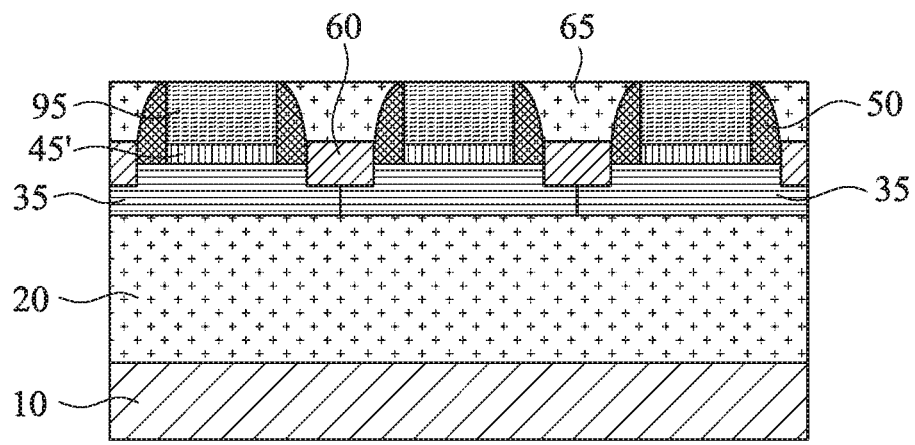
FIG. 34 shows one of the various stages of manufacturing a semiconductor FET device according to another embodi
Figure 35:
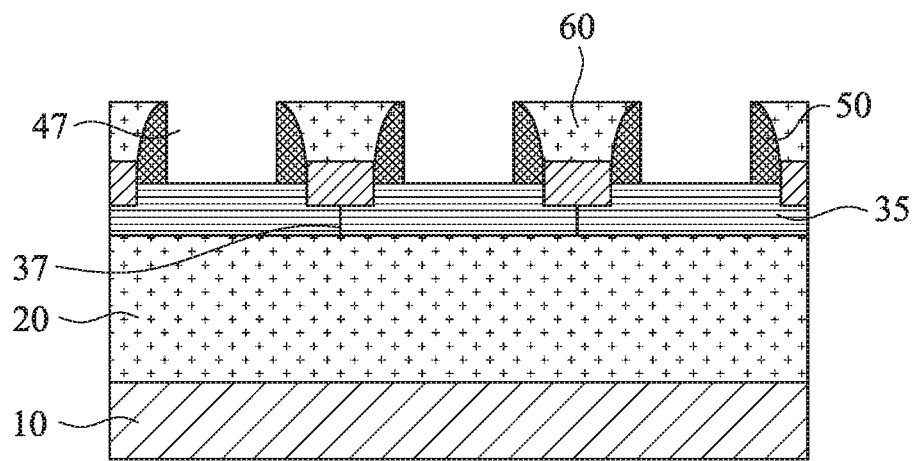
- FIG. 35 shows one of the various stages of manufacturing a semiconductor FET device according to another embodiment of the present disclosure.

Then, a first interlayer dielectric (ILD) layer 65 is formed over the source/drain epitaxial layers 60 and the patterned dummy gate layer 95 and patterned seed layers 45. The materials for the first ILD layer 65 include compounds comprising Si, O, C and/or H, such as silicon oxide, SiCOH and SiOC. Organic materials, such as polymers, may be used for the first ILD layer 65. After the first ILD layer 65 is formed, a planarization operation, such as CMP, is performed, so that the top portions of the patterned dummy gate layer 95 and patterned seed layers 45 are exposed, as shown in FIG. 34. In some embodiments, the patterned dummy gate layer 95 functions as a CMP stop layer. In some embodiments, before the first ILD layer 65 is formed, a contact etch stop layer, such as a silicon nitride layer or a silicon oxynitride layer, is formed.

Then, the patterned dummy gate layer 95 and patterned seed layers 45 are removed, thereby forming gate spaces 47, as shown in FIG. 22. The patterned dummy gate layer 95 and patterned seed layers 45 can be removed using plasma dry etching and/or wet etching. When the patterned dummy gate layer 95 is polysilicon or amorphous silicon, a wet etchant such as a tetramethylammonium hydroxide (TMAH) solution can be used to selectively remove the dummy gate layer. The patterned seed layers 45 are thereafter removed using plasma dry etching and/or wet etching.

Figure 36A:
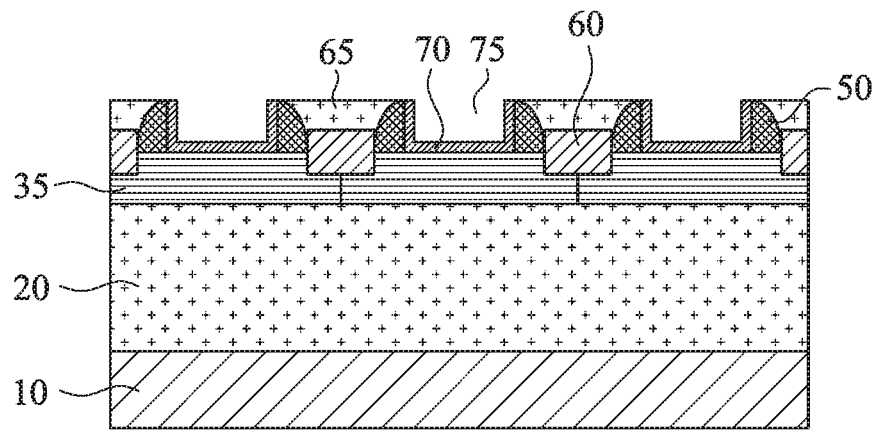
FIG. 36A shows one of the various stages of manufacturing a semiconductor FET device according to another embodiment of the present disclosure.

After the patterned dummy gate layer 95 and patterned seed layers 45 are removed, a gate dielectric layer 70 and a gate electrode 75 are formed in each of the gate spaces 47, as shown in FIG. 36A. In some embodiments, the gate dielectric layer 70 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HMO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 70 includes an interfacial layer formed between the channel layer 35 and the dielectric material, by using chemical oxidation. The gate dielectric layer 70 may be formed by CVD, ALD or any suitable method. In one embodiment, the gate dielectric layer 70 is formed using a highly conformal deposition process such as ALD in order to ensure the formation of a gate dielectric layer having a uniform thickness around each channel layer. The thickness of the gate dielectric layer 70 is in a range from about 1 nm to about 10 nm in one embodiment.

Subsequently, a gate electrode layer 75 is formed on the gate dielectric layer 70. The gate electrode layer 70 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 75 may be formed by CVD, ALD, electro-plating, or other suitable method. The metals for the gate dielectric layer 70 and the gate electrode layer 75 are also deposited over the upper surface of the first ILD layer 65. The material for the gate electrode layer formed over the ILD layer 65 is then planarized by using, for example, CMP, until the top surface of the ILD layer 65 is revealed. In some embodiments, after the planarization operation, the metal gate electrode layer 77 is recessed and a cap insulating layer (not shown) is formed over the recessed gate electrode layer. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 70 and the gate electrode layer 75. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Further, similar to FIG. 13A, a second ILD layer is formed over the first ILD layer, and conductive contacts passing through the second ILD layer or the second and first ILD layers are formed to contact the gate electrode and the source/drain epitaxial layers. As shown in FIG. 13A, the manufactured FET is a thin film transistor (TFT) in some embodiments.

Figure 36B:
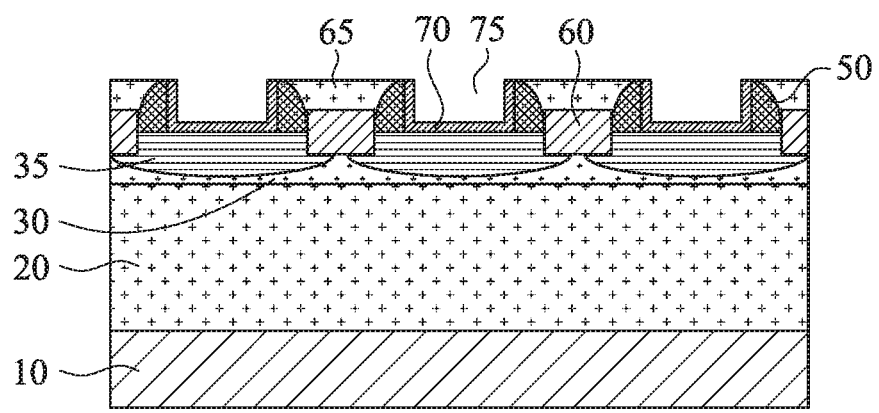
FIG. 36B shows one of the various stages of manufacturing a semiconductor FET device according to another embodiment of the present disclosure.

In other embodiments, the crystallization process stops before each of front portions of the crystallized semiconductor layers 35 meet the adjacent front portion of the crystallized semiconductor layers 35. In such a case, a portion of non-crystallized semiconductor layer 30 remains between adjacent FETs, as shown in FIG. 36B.

It is understood that the FET undergoes further CMOS processes to form various features such as contacts/vias, interconnect metal layers, dielectric layers, passivation layers, etc.

Figure 37:
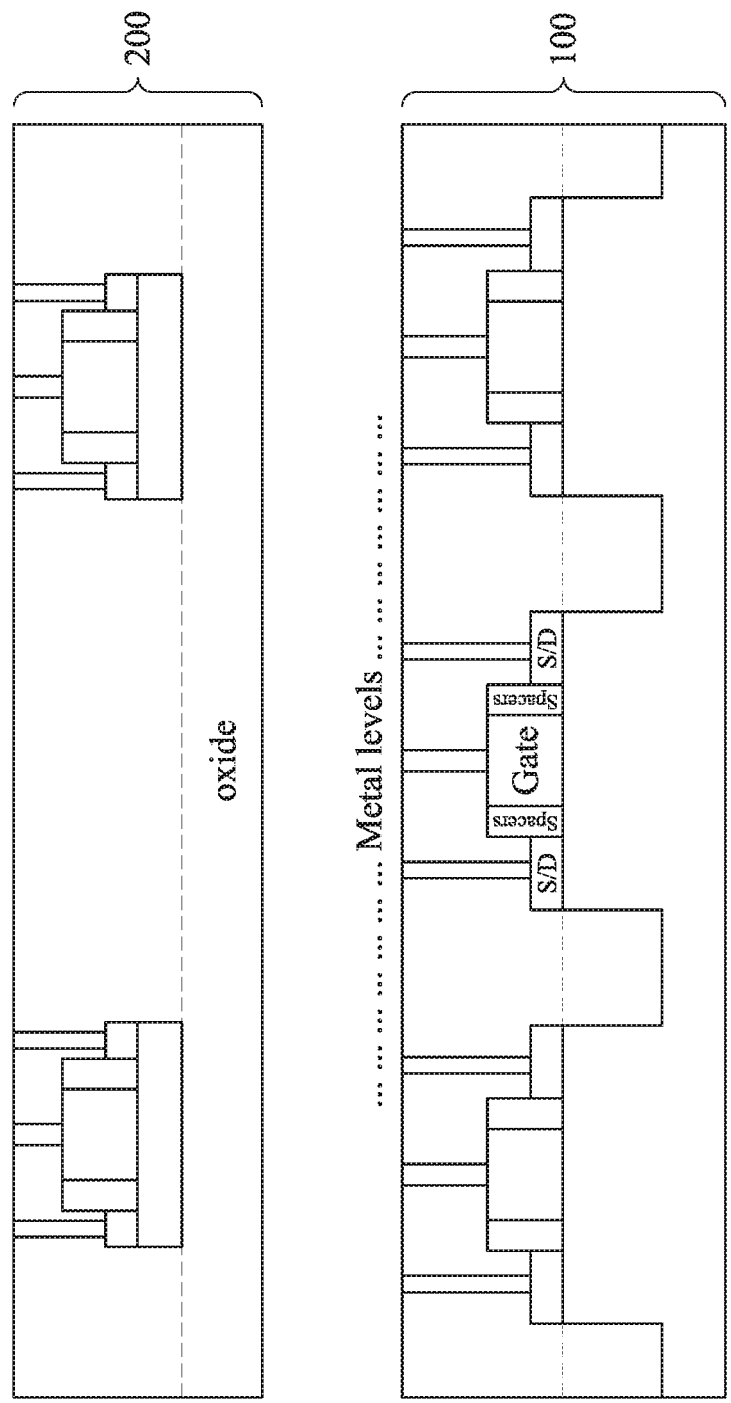
FIG. 37 shows a cross sectional view of a semiconductor FET device according to an embodiment of the present disclosure.

FIG. 37 shows a cross sectional view of a semiconductor device according to an embodiment of the present disclosure. As shown in FIG. 37, a lower layer device 100 is formed over a substrate. The lower layer devices 100 includes one or more fin field effect transistors (FinFETs), gate-all-around FET (GAA FET), planar FETs, vertical FETs or any other electronic devices. FIG. 37 also shows an upper layer device 200 disposed over the lower layer device 100. In some embodiments, one or more ILD layers, metal wiring layers and/or via contacts are disposed between the lower layer device 100 and the upper layer device 200. In some embodiments, the upper layer device 200 includes one or more FETs manufactured by the aforementioned embodiments of the present disclosure.

The various embodiments or examples described herein offer several advantages over the existing art. For example, in the present disclosure, a crystallization process of a non-crystal semiconductor layer is performed using a patterned seed layer formed on the non-crystal semiconductor layer (a top seed layer). Since the crystallization of the non-crystal semiconductor layer starts from the bottom of the patterned seed layer and the patterned seed layer is utilized as a dummy gate, it is possible to utilize the initially crystalized portion (closer to the seed layer) having a higher crystalline quality, as a channel region of an FET. In other words, the best crystalline portions can be utilized as channel regions in a self-aligned manner. Further, by utilizing the seed layer as a dummy gate for a gate replacement process, it is possible to suppress an increase in operation steps of manufacturing the semiconductor device. The operations of the present disclosure is compatible with back-end-of-line processes of the semiconductor manufacturing.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a semiconductor layer is formed on a dielectric layer disposed over a substrate. A seed layer is formed on the semiconductor layer. The seed layer is patterned into a patterned seed layer. Aa crystallization operation is performed on the semiconductor layer using the patterned seed layer as a seed of crystallization, thereby forming a crystallized semiconductor layer. In one or more of the foregoing and the following embodiments, the seed layer is MgO. In one or more of the foregoing and the following embodiments, the semiconductor layer is amorphous or poly crystal. In one or more of the foregoing and the following embodiments, the semiconductor layer is one of Si, SiGe and Ge. In one or more of the foregoing and the following embodiments, a thickness of the seed layer is in a range from 1 nm to 10 nm. In one or more of the foregoing and the following embodiments, a thickness of the semiconductor layer is in a range from 10 nm to 50 nm. In one or more of the foregoing and the following embodiments, the crystallization operation includes a thermal annealing at a temperature from 350° C. to 450° C. or a laser annealing. In one or more of the foregoing and the following embodiments, sidewall spacers are formed on opposing side faces of the patterned seed layer. A source/drain structure is formed. An interlayer dielectric (ILD) layer is formed over the sidewall spacers, the patterned seed layer and the source/drain structure. After the ILD layer is formed, the patterned seed layer is removed, thereby forming a gate space. A gate dielectric layer and a gate electrode layer are formed in the gate space.

In accordance with another aspect of the present disclosure, in method of manufacturing a semiconductor device, a semiconductor layer is formed on a dielectric layer disposed over a substrate. A seed layer is formed on the semiconductor layer. The seed layer is patterned into patterned seed layers. A crystallization operation is performed on the semiconductor layer using the patterned seed layers as a seed of crystallization, thereby forming crystallized semiconductor layers. In one or more of the foregoing and the following embodiments, the seed layer is MgO. In one or more of the foregoing and the following embodiments, the semiconductor layer is amorphous or poly crystal of one of Si, SiGe and Ge. In one or more of the foregoing and the following embodiments, the crystallization operation includes a thermal annealing at a temperature from 350° C. to 450° C. or a laser annealing. In one or more of the foregoing and the following embodiments, sidewall spacers are formed on opposing side faces of the patterned seed layers. A source/drain structure is formed. An interlayer dielectric (ILD) layer is formed over the sidewall spacers, the patterned seed layers and the source/drain structure. After the ILD layer is formed, the patterned seed layers are removed, thereby forming gate spaces. A gate dielectric layer and a gate electrode layer are formed in each of the gate spaces. In one or more of the foregoing and the following embodiments, the crystallization operation is performed such that a front portion of a crystallized semiconductor layer under one of the seed layers meets a front portion of a crystallized semiconductor layer under another of the seed layers adjacent to the one of the seed layers, thereby forming a grain boundary. In one or more of the foregoing and the following embodiments, the crystallization operation is stopped before a front portion of a crystallized semiconductor layer under one of the seed layers meets a front portion of a crystallized semiconductor layer under another of the seed layers adjacent to the one of the seed layers.

In accordance with another aspect of the present disclosure, in a method of manufacturing a semiconductor device, a semiconductor layer is formed on a dielectric layer disposed over a substrate. A seed layer is formed on the semiconductor layer. A dummy gate layer is formed on the seed layer. The dummy gate layer and the seed layer are formed into a patterned dummy gate layer and a patterned seed layer. A crystallization operation is performed on the semiconductor layer using the patterned seed layer as a seed of crystallization, thereby forming a crystallized semiconductor layer. In one or more of the foregoing and the following embodiments, the dummy gate layer is amorphous or poly crystal of one of Si, SiGe and Ge. In one or more of the foregoing and the following embodiments, a thickness of the dummy gate layer is in a range from 50 nm to 200 nm. In one or more of the foregoing and the following embodiments, the seed layer is MgO. In one or more of the foregoing and the following embodiments, sidewall spacers are formed on opposing side faces of the patterned dummy gate layer and the patterned seed layer. A source/drain structure is formed. An interlayer dielectric (ILD) layer is formed over the sidewall spacers, the patterned dummy gate layer and the source/drain structure. After the ILD layer is formed, the patterned dummy gate layer and the patterned seed layer are removed, thereby forming a gate space. A gate dielectric layer and a gate electrode layer are formed in the gate space.

In accordance with one aspect of the present disclosure, a semiconductor device includes a channel formed as a part of a semiconductor layer disposed on a dielectric layer, a gate dielectric layer disposed over the channel, a gate electrode layer disposed over the gate dielectric layer, sidewall spacers disposed on opposite side faces of the gate electrode layer, and a source and a drain. The semiconductor layer includes a crystal portion as the channel and a non-crystal portion. In one or more of the foregoing and the following embodiments, the semiconductor device further includes one or more transistors covered by the dielectric layer. In one or more of the foregoing and the following embodiments, the one or more transistors include fin field effect transistors. In one or more of the foregoing and the following embodiments, the semiconductor layer is made of one of Si, SiGe and Ge. In one or more of the foregoing and the following embodiments, a thickness of the semiconductor layer is in a range from 10 nm to 50 nm.

In accordance with another aspect of the present disclosure, a semiconductor device includes an electronic device disposed on a substrate, one or more dielectric layers disposed over the electronic device, thin film transistors disposed on an uppermost layer of the one or more dielectric layers. Each of the thin film transistor includes a channel formed as a part of a semiconductor layer disposed on the uppermost layer, a gate dielectric layer disposed over the channel, a gate electrode layer disposed over the gate dielectric layer, sidewall spacers disposed on opposite side faces of the gate electrode layer, and a source and a drain. The semiconductor layer is single crystal, and a grain boundary exists between the semiconductor layer of one of the thin film transistors and the semiconductor layer of another of the thin film transistors adjacent to the one of the thin film transistors. In one or more of the foregoing and the following embodiments, the electronic device is a transistor. In one or more of the foregoing and the following embodiments, the transistor is one of a fin field effect transistor and a gate-all-around transistor. In one or more of the foregoing and the following embodiments, the semiconductor layer is made of one of Si, SiGe and Ge. In one or more of the foregoing and the following embodiments, the uppermost layer is made of silicon oxide. In one or more of the foregoing and the following embodiments, a thickness of the semiconductor layer is in a range from 10 nm to 50 nm. In one or more of the foregoing and the following embodiments, the source and the drain includes an epitaxial semiconductor layer. In one or more of the foregoing and the following embodiments, the epitaxial semiconductor layer is in contact with one of the sidewall spacers of the one of the thin film transistors and one of the sidewall spacers of the another one of the thin film transistors.

In accordance with another aspect of the present disclosure, a semiconductor device includes an electronic device disposed on a substrate, one or more dielectric layers disposed over the electronic device, and thin film transistors disposed on an uppermost layer of the one or more dielectric layers. Each of the thin film transistor includes, a channel formed as a part of a semiconductor layer disposed on the uppermost layer, a gate dielectric layer disposed over the channel, a gate electrode layer disposed over the gate dielectric layer, sidewall spacers disposed on opposite side faces of the gate electrode layer, and a source and a drain. The channel is single crystal, and a non-crystalline semiconductor layer made of a same material as the semiconductor layer exists between the semiconductor layer of one of the thin film transistors and the semiconductor layer of another of the thin film transistors adjacent to the one of the thin film transistors. In one or more of the foregoing and the following embodiments, the electronic device is a transistor. In one or more of the foregoing and the following embodiments, the transistor is one of a fin field effect transistor and a gate-all-around transistor. In one or more of the foregoing and the following embodiments, the semiconductor layer is made of one of Si, SiGe and Ge. In one or more of the foregoing and the following embodiments, a thickness of the semiconductor layer is in a range from 10 nm to 50 nm. In one or more of the foregoing and the following embodiments, the source and the drain includes an epitaxial semiconductor layer. In one or more of the foregoing and the following embodiments, the epitaxial semiconductor layer is in contact with one of the sidewall spacers of the one of the thin film transistors and one of the sidewall spacers of the another one of the thin film transistors.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming dielectric layer over a substrate;
   forming a semiconductor layer on the dielectric layer so that the dielectric layer is disposed between the substrate and the semiconductor layer;
   forming a seed layer on the semiconductor layer;
   patterning the seed layer into a patterned seed layer by using lithography and etching operations; and
   performing a crystallization operation on the semiconductor layer using the patterned seed layer as a seed of crystallization, thereby forming a crystallized semiconductor layer.

2. The method of claim 1, wherein the seed layer is MgO.

3. The method of claim 1, wherein the semiconductor layer is amorphous or poly crystal.

4. The method of claim 3, wherein the semiconductor layer is one of Si, SiGe and Ge.

5. The method of claim 1, wherein a thickness of the seed layer is in a range from 1 nm to 10 nm.

6. The method of claim 1, wherein a thickness of the semiconductor layer is in a range from 10 nm to 50 nm.

7. The method of claim 1, wherein the crystallization operation includes a t annealing at a temperature from 350° C. to 450° C. or a laser annealing.

8. The method of claim 1, further comprising:
   forming sidewall spacers on opposing side faces of the patterned seed layer;
   forming a source/drain structure;
   forming an interlayer dielectric (ILD) layer over the sidewall spacers, the patterned seed layer and the source/drain structure;
   after the ILD layer is formed, removing the patterned seed layer, thereby forming a gate space; and
   forming a gate dielectric layer and a gate electrode layer in the gate space.

9. A method of manufacturing a semiconductor device, the method comprising:
   forming dielectric layer over a substrate;
   forming an amorphous or a poly crystal semiconductor layer on the dielectric layer such that the dielectric layer is disposed between the substrate and the semiconductor layer;
   forming a seed layer on the semiconductor layer;
   patterning the seed layer into multiple patterned seed layers by using lithography and etching operations; and
   performing a crystallization operation on the semiconductor layer using the patterned seed layers as a seed of crystallization, thereby forming multiple single crystalline semiconductor layers over the dielectric layer.

10. The method of claim 9, wherein the seed layer is MgO.

11. The method of claim 9, wherein the semiconductor layer is amorphous or poly crystal of one of Si, SiGe and Ge.

12. The method of claim 9, wherein the crystallization operation includes a thermal annealing at a temperature from 350° C. to 450° C. or a laser annealing.

13. The method of claim 9, further comprising:
   forming sidewall spacers on opposing side faces of the patterned seed layers;
   forming a source/drain structure;
   forming an interlayer dielectric (ILD) layer over the sidewall spacers, the patterned seed layers and the source/drain structure;
   after the ILD layer is formed, removing the patterned seed layers, thereby forming gate spaces; and
   forming a gate dielectric layer and a gate electrode layer in each of the gate spaces.

14. The method of claim 9, wherein the crystallization operation is performed such that a front portion of a crystallized semiconductor layer under one of the seed layers meets a front portion of a crystallized semiconductor layer under another of the seed layers adjacent to the one of the seed layers, thereby forming a grain boundary.

15. The method of claim 9, wherein the crystallization operation is stopped before a front portion of a crystallized semiconductor layer under one of the seed layers meets a front portion of a crystallized semiconductor layer under another of the seed layers adjacent to the one of the seed layers.

16. A method of manufacturing a semiconductor device, the method comprising:
   forming a semiconductor layer on a dielectric layer disposed over a substrate;
   forming a seed layer on the semiconductor layer;
   forming a dummy gate layer on the seed layer;
   patterning the dummy gate layer and the seed layer into a patterned dummy gate layer and a patterned seed layer; and
   performing a crystallization operation on the semiconductor layer using the patterned seed layer as a seed of crystallization, thereby forming a crystallized semiconductor layer.

17. The method of claim 16, wherein the dummy gate layer is amorphous or poly crystal of one of Si, SiGe and Ge.

18. The method of claim 16, wherein a thickness of the dummy gate layer is in a range from 50 nm to 200 nm.

19. The method of claim 16, wherein the seed layer is MgO.

20. The method of claim 16, further comprising:
   forming sidewall spacers on opposing side faces of the patterned dummy gate layer and the patterned seed layer;

forming a source/drain structure;

forming an interlayer dielectric (ILD) layer over the sidewall spacers, the patterned dummy gate layer and the source/drain structure;

after the ILD layer is formed, removing the patterned dummy gate layer and the patterned seed layer, thereby forming a gate space; and forming a gate dielectric layer and a gate electrode layer in the gate space.

* * * * *